United States Patent [19]

Miura et al.

[11] Patent Number: 5,565,706

[45] Date of Patent: Oct. 15, 1996

[54] LSI PACKAGE BOARD

[75] Inventors: Osamu Miura, Ibaraki-ken; Akio Takahashi, Hitachiota; Takao Miwa, Hitachinaka; Masahiro Suzuki, Iwaki; Ryuji Watanabe; Junichi Katagiri, both of Ibaraki-ken; Yoichi Daiko, Zama; Tsutomu Imai, Hadano; Haruo Akahoshi, Hitachi, all of Japan

[73] Assignee: Hitachi, Ltd., Tokyo, Japan

[21] Appl. No.: 407,081

[22] Filed: Mar. 20, 1995

[30] Foreign Application Priority Data

Mar. 18, 1994 [JP] Japan .................................. 6-048235

[51] Int. Cl.$^6$ .......................... H01L 23/48; H01L 23/52; H01L 29/40
[52] U.S. Cl. .......................... 257/723; 257/700; 257/691
[58] Field of Search .................................. 257/778, 782, 257/783, 905, 909, 910, 777, 723, 724, 685, 686, 691, 700

[56] References Cited

U.S. PATENT DOCUMENTS

| | | | |
|---|---|---|---|
| 4,322,778 | 3/1982 | Barbour et al. | 257/724 |
| 4,672,421 | 6/1987 | Lin | 257/778 |
| 5,049,978 | 9/1991 | Bates et al. | 257/686 |
| 5,280,192 | 1/1994 | Kryzaniwasky | 257/691 |
| 5,315,486 | 5/1994 | Fillion et al. | 257/724 |
| 5,331,203 | 7/1994 | Wojnarowski et al. | |
| 5,391,917 | 2/1995 | Gilmour et al. | 257/724 |

FOREIGN PATENT DOCUMENTS

| | | |
|---|---|---|
| 0435530 | 12/1990 | European Pat. Off. . |
| 0450948 | 4/1991 | European Pat. Off. . |
| 0465196 | 7/1991 | European Pat. Off. . |
| 63-239898 | 10/1988 | Japan . |
| 2-246144 | 10/1990 | Japan .................... 257/691 |
| 5-82717 | 4/1993 | Japan .................... 257/691 |
| 2274200 | 11/1991 | United Kingdom . |

OTHER PUBLICATIONS

M. Gdula et al, "An Overlay Interconnect Technology for 1GHz and Above MCMs", IEEE, Mar. 18–20, 1992, Santa Cruz, CA, pp. 171–174.

M. Gdula et al., "High Density Overlay Interconnect (HDI) Delivers High Frequency Performance for GaAs Systems", IEEE, Mar. 15–18, 1993, pp. 33–38.

M. Gdula et al., "A High-Speed, High Density Multiprocessing Module Made with the General Electric High-Density Interconnect Technology", Digital Signal Processing, vol. 2, No. 4, Oct. 1992, pp. 247–251.

IBM J. Res. Develop., vol. 26, No. 1, Jan. 1982, Donald J. Seraphim, "A New Set of Printed-Circuit Technologies for the IBM 3081 Processor Unit".

Primary Examiner—Sara W. Crane
Assistant Examiner—S. V. Clark
Attorney, Agent, or Firm—Antonelli, Terry, Stout & Kraus

[57] ABSTRACT

A thin and high-density package board used with general-purpose mainframe computers and high-speed processors is provided. On a ceramic substrate on which memory LSIs and a logic LSI with only elements formed without multi-layer wiring are mounted, a multilayer wiring layer insuring signal transfer of the LSIs is formed, providing a thin package board.

24 Claims, 9 Drawing Sheets

LSI PACKAGE BOARD

BACKGROUND OF THE INVENTION

1. Field of the Invention

This invention relates to a package board that can be intended for a high-density module board of large-scale integrated circuit (LSI) devices used with general-purpose mainframe computers, workstations, high-speed processors, etc., and can also be manufactured at low costs. The invention is also applicable to LSI modules for connecting a local area network (LAN) to personal computers. For example, the invention also enables a module board (LAN card) to be built in a personal computer so that the module board can drive a LAN on the personal computer. Large-capacity memory cards are required as personal computers providing high functions, in which case the concept of the package board of the invention can also be used.

2. Description of the Related Art

To speed up signal transfer from one LSI to another, it becomes increasingly important for a package board such as an LSI module board for general-purpose mainframe computers, workstations, high-speed processors, etc., to enable a number of LSIs to be packaged on the board at a high density and a signal delay in the board to be minimized. However, a state-of-the-art capable of manufacturing boards which can be downsized for portable devices at low costs while satisfying the board requirements has not yet been provided.

As mainframe computers become faster, printed circuit boards used with the computers need to be highly multilayered at a higher density. A method of directly mounting LSI chips on a multilayer printed Circuit board, which will be hereinafter referred to as bear chip packaging, is available for packaging LSI chips at a high density. Ceramic family board material, for example, as described in "A New Set of Printed-Circuit Technologies for the IBM3081 Processor Unit" IBM.J.RES.DEVELOP: Vol.26, No.1, January, 1982," is put into practical use as boards on which LSIs are mounted. However, since ceramic family material is high in a dielectric constant and is high in board formation temperature, tungsten or molybdenum having higher resistance than copper is used as wiring conductors, leading to a disadvantage in the propagation speed of an electric signal. It would be most desirable in a new packaging method for a multilayer circuit board allowing to use copper for wiring conductors and use polymeric organic substance having a low dielectric constant as an insulating layer. However, in the related art, a long process time is needed for forming the insulating layer and flatting it out thereby making it difficult to achieve high yield.

Particularly, as computers become faster, the processor operation frequency becomes higher. Especially, high-speed processors having Open architecture operate at high frequencies of from 500 MHz to 10 GHz. To cope with the high operation frequencies, a signal wiring circuit needs to be made shorter and the insulating film material for insulating the wiring needs to be a thick film having a low dielectric constant. Polyimide is named as optimum insulating film material for the required characteristics. Package boards, multilayer wiring boards, etc., using polyimide are introduced in Japanese Patent Laid-Open No. Sho 63-239898, etc. However, the characteristic impedance of an LSI package board compatible with the above-mentioned high-speed processors, particularly that of a multilayer wiring board which insures LSI-to-LSI signal transfer, needs to be in the range from 50 Ω to 250 Ω. To meet such a requirement, the polyimide film needs to be 10 to 50 μm thick as an insulating layer. For impedance matching, there must be few variations in the film thicknesses of the insulating layers and each layer must be flat. It is difficult to maintain uniformity of film thicknesses of polyimide insulating films in a sequentially layering method as in a multilayer wiring process of LSIs.

In manufacturing technologies of package boards, the related art encounters various problems in following high-performance package boards. For example, a thin-film and thick-film mix board receives attention and is under development; it is formed with polyimide as an interlayer insulating film, and with Cu or Al as conductor layers by a thin film process on a ceramic substrate comprising wiring layers of W, Mo, etc. laminated and sintered by a thick film process. Polyimide in the thin-film wiring portion has a smaller dielectric constant than ceramic, Cu or Al wiring of low resistance can be used, and high-speed and high-density signal transfer is enabled by using a semiconductor manufacturing process. However, the number of gates mounted per unit area increases with high performance of computers; to cope with this, the number of laminated thin-film wiring layers will be increased.

Several techniques of forming thin-film multilayer wiring have been already reported. The basic process uses a thin film process of patterning on conductor, through hole, and polyimide layers on a ceramic or Si substrate by exposing and developing a photoresist. The thin film process is appropriate for making fine wiring, but it leads to a so-called sequential laminating technique of forming conductor and through hole layers one at a time. It takes enormous amount of time in forming thin-film wiring with a large number of laminated layers. Further, in the process, the entire substrate (board) becomes defective due to a failure occurring in the final step, resulting in a low yield, leading to high production costs.

In the thin-film wiring, if the wiring width is made fine, the wiring thickness must be increased for providing a cross-sectional area which is sufficient to maintain the wiring resistance low. Preferably, the insulating layer is substantially as thick as the wiring film from the viewpoint, of characteristic impedance ($Z_0$) matching of the wiring. The insulating films of the wiring layers need to be completely uniformly flattened and variations in the insulating layer thicknesses of the layers must also be suppressed to 5% or less. However, in the state-of-the-art method, the wiring layer thickness becomes equal to or greater than the line width; it is difficult to provide flatness even if a fluid polyamic acid is used. Thus, the following steps are required: A polyamic acid is thermally set to form a polyimide film, then the film is flattened by a method such as grinding, lapping, or polishing, and lower conductor wiring is led out. Particularly, in this sequence of steps, the process time increases and the yield becomes hard to enhance in proportion to a requirement for accuracy of flatness of the final wiring layer surface, and wiring pattern accuracy worsens and broken lines or short circuits often occur with an increase in the number of laminated layers.

Further, the ceramic substrate having input/output terminals and the lower thin-film wiring portion are repeatedly subjected to a thermal history and immersion in water, chemicals, etc., the interface is degraded and contamination is caused by impurity ions, lowering reliability.

SUMMARY OF THE INVENTION

It is therefore an object of the invention to provide a package board, such as an LSI module board for general-purpose mainframe computers, workstations, and high-speed processors, which enables a number of LSIs to be mounted at a high density for high-speed signal transfer and which can be downsized for portable devices at low costs as a package board.

It is another object of the invention to provide a structure enabling thin film wiring layer formation in a short time at a good yield even if a package board having a thin film wiring layer with a large number of layers.

To the ends, according to a first form of the invention, there is provided a package board comprising at least one memory large-scaled integrated circuit device, at least one logic large-scaled integrated circuit device, a substrate for mounting the devices, and a multilayer wiring circuit layer formed on the substrate, wherein signal circuitry of the memory and logic large-scaled integrated circuit devices is formed in the multilayer wiring circuit layer on the substrate and is electrically connected to the memory and logic large-scaled integrated circuit devices via external terminals of the memory and logic large-scaled integrated circuit devices.

According to a second form of the invention, there is provided a package board comprising at least one memory large-scaled integrated circuit device, at least one logic large-scaled integrated circuit device, a substrate for mounting the devices, and a multilayer wiring circuit layer formed on the substrate, wherein signal circuitry of the memory and logic large-scaled integrated circuit devices is formed in the multilayer wiring circuit layer on the; substrate and is electrically connected to the memory and logic large-scaled integrated circuit devices via external terminals of the memory and logic large-scaled integrated circuit devices, the multilayer wiring circuit layer being provided with a repair circuit of the memory and logic large-scaled integrated circuit devices.

According to a third form of the invention, there is provided a package board comprising at least one memory large-scaled integrated circuit device, at least one logic large-scaled integrated circuit device, a substrate for mounting the devices, and a multilayer wiring circuit layer formed on the substrate, wherein signal circuitry of the memory and logic large-scaled integrated circuit devices is formed in the multilayer wiring circuit layer on the substrate and is electrically connected to the memory and logic large-scaled integrated circuit devices via external terminals of the memory and logic large-scaled integrated circuit devices, the multilayer wiring circuit layer having a smaller wiring resistance than that of the memory and logic large-scaled integrated circuit devices.

According to a fourth form of the invention, there is provided a package board comprising at least one memory large-scaled integrated circuit device, at least one logic large-scaled integrated circuit device, a substrate for mounting the devices, and a multilayer wiring circuit layer formed on the substrate, wherein signal circuitry of the memory and logic large-scaled integrated circuit devices is formed in the multilayer wiring circuit layer on the substrate and is electrically connected to the memory and logic large-scaled integrated circuit devices via external terminals of the memory and logic large-scaled integrated circuit devices, the multilayer wiring circuit layer having a characteristic impedance of 50–250Ω and a wiring pitch of 1 μm–50 μm.

According to a fifth form of the invention, there is provided a package board comprising at least one memory large-scaled integrated circuit device, at least one logic large-scaled integrated circuit device, a substrate for mounting the devices, and a multilayer wiring circuit layer formed on the substrate, wherein signal circuitry of the memory and logic large-scaled integrated circuit devices is formed in the multilayer wiring circuit layer on the substrate and is electrically connected to the memory and logic large-scaled integrated circuit devices via external terminals of the memory and logic large-scaled integrated circuit devices, and wherein matching of signal transfer in an operation frequency zone of 500 MHz–10 GHz is enabled.

According to a sixth form of the invention, there is provided a package board comprising at least one memory large-scaled integrated circuit device, at least one logic large-scaled integrated circuit device, a substrate into which the devices are embedded, and a multilayer wiring circuit layer formed on the substrate, wherein signal circuitry of the memory and logic large-scaled integrated circuit devices is formed in the multilayer wiring circuit layer on the substrate and is electrically connected to the memory and logic large-scaled integrated circuit devices via external terminals of the memory and logic large-scaled integrated circuit devices, the package board having a thickness of 1 mm thick or less.

According to a seventh form of the invention, there is provided a local area network integrated circuit card comprising a package board comprising at least one memory large-scaled integrated circuit device, at least one logic large-scaled integrated circuit device, a substrate for mounting the devices, and a multilayer wiring circuit layer formed on the substrate, wherein i signal circuitry of the memory and logic large-scaled integrated circuit devices is formed in the multilayer wiring circuit layer on the substrate and is electrically connected to the memory and logic large-scaled integrated circuit devices via external terminals of the memory and logic large-scaled integrated circuit devices.

According to an eighth form of the invention, there is provided a memory large-scaled integrated circuit element card comprising a package board comprising at least one memory large-scaled integrated circuit device, a substrate for mounting the device, and a multilayer wiring circuit layer formed on the substrate, wherein signal circuitry of the memory large-scaled integrated circuit device is formed in the multilayer wiring circuit layer on the substrate and is electrically connected to the memory large-scaled integrated circuit device via external terminals of the memory large-scaled integrated circuit device.

Means for manufacturing the package boards enabling high-speed signal transfer at low costs for enhancing a yield is as follows:

In the process of manufacturing the multilayer wiring layer of the signal circuitry of the package board, an insulating film sheet where polyimide is previously cured for providing a uniform film thickness is used as a manufacturing method of the insulating film of each layer. To maintain intralayer flatness, a 2-layer sheet is provided by combining with a fluid and adhesive insulating film sheet by applying heat and pressure. Assume that the former polyimide sheet is (A) and that the latter sheet is (B). The film thickness of the sheet (A) does not change in the heat and pressure application process. The film thickness after the space between lines of the wiring film in the sheet (B) layer is completely filled is assumed to set the initial film thickness. The film thickness of the final sheet (B) and that of the sheet (A) are added together, resulting in the insulating layer thickness. The characteristic impedance can be set in the range of 50 to 250Ω by providing the insulating layer as a desired constant film thickness by such a method.

The invention provides a process coping with fine wiring to shorten the signal wiring circuit length for downsizing. Then, the manufacturing method of the multilayer wiring board comprises the steps of:

(1) heating and crimping combined insulating film sheet onto a conductor wiring portion for forming an flattened insulating layer having a thickness given times the thickness of the conductor wiring portion;

(2) making nonthrough holes in the insulating layer formed in the step (1) by using a laser drilling or etching;

(3) embedding interlayer connection wiring of the multilayer wiring board in the: nonthrough holes formed in the step (2) by plating or vapor deposition, sputtering, CVD for providing a flattened wiring layer comprising the insulating layer formed in the step (1); and (4) forming conductor wiring of a given thickness on the wiring layer formed in the step (3) by a subtractive or additive method, then repeating steps (1) to (3) for forming multiple layers.

This process enables application of a wiring rule of wiring pitch 1–50 μm.

A number of methods are proposed for MCM (multi-chip module). These methods are classified according to the type and structure of wiring board. The chip operation speed is increased rapidly because of the advance of the silicone treatment technique. However, when chips are mounted on a circuit board, the operation speed is limited, leading to a factor for determining the speed of a package and circuit board system. Thus, in the conventional surface-mounting technique, it is becoming difficult to provide transfer characteristics in high-speed areas. Then, to shorten the delay time occurring in a package as much as possible, a multi-chip module comprises as many bear chips as possible mounted in one package for shortening the delay time. Particularly, MCM of an Si on Si structure, MCM comprising thin-film multilayer wiring formed on a ceramic substrate, and the like are released to exert the high-speed performance of microprocessors (MPUs) used for high-speed processing of workstations, etc. However, in the state-of-the-art method, the wiring yield of Si substrates leads directly to the product yield of the MCMs. To enhance the MCM yield, a multilayer wiring film manufactured as another body and previously selected as a good product is bonded to and laminated on a wiring film of an Si substrate.

As a particularly important point, to maintain the LSI yield 0 with high integration and large size of LSIs, only functional element circuitry of P and N elements, etc., is wired in LSIs and intraLSI and interLSI signal transfer circuitry is wired separately from the functional element circuitry, then bonded to a substrate such as an Si or ceramic substrate for electric connection to the LSIs. The signal transfer circuitry is wired with copper having small resistance, whereby it has wiring resistance lower than that inside of an LSI. According to the manufacturing method, there can be provided a package board comprising at least one memory integrated circuit device, at least one logic integrated circuit device, a substrate for mounting the devices, and a multilayer wiring layer formed on the substrate, wherein the multilayer wiring layer enables electric connection between the substrate and the memory and logic integrated circuit devices, the package board having a characteristic impedance in the range of 50 to 250Ω, a wiring rule of a wiring pitch of 1 μm to 50 μm, and wiring resistance lower than the integrated circuit devices, thereby enabling matching of signal transfer in an operation frequency zone of 500 MHz to 10 GHz.

According to the invention, a wiring board on which high-speed LSIs are mounted can be manufactured by using a flat and heat resisting adhesive sheet for an insulating film of a semiconductor package board.

Basic components of an LSI are active elements such as transistors and diodes, passive elements such as resistors and capacitors, isolation layers for electrically insulating the elements from each other, and wiring for connecting the elements. The yield and reliability in the manufacturing process of the active elements, passive elements, and isolation layers have been drastically improved because of a quantum leap of techniques. On the other hand, wiring formation techniques have not improved much as compared with those of the active elements, passive elements, and isolation layers. Presently, the trend has been towards the development of higher speed LSIs and larger LSIs, and the product yield of such large-scaled high-integrated chips depends mostly on the wiring formation, especially multilayer formation techniques. This is caused by the fact that it is difficult to flatten an insulating layer ($SiO_2$) and micromachine wiring. Aluminum wiring is most generally used at present. However, as the aluminum wiring becomes finer with high integration, the electromigration occurrence frequency also increases. Further, a delay caused by wiring resistance introduces a problem in high-speed LSIs.

To solve the problems, the wiring portion is drawn out to the outside of an LSI and gold or copper which is lower in resistance than aluminum and enables formation of a thick film is used as wiring metal and a polyimide resin which has high flatness is used for an insulating layer to form wiring. Thus, by drawing out the wiring to the outside, the wiring resistance can be drastically reduced (−0.5Ω/cm) as compared with the case where the wiring is placed in the LSI (−10Ω/cm). The electromigration occurrence problem can also be solved by using gold or copper.

With LSIs requiring high-speed operation, to lessen interlayer capacity, the insulating layer is thickened which may lead to increases in silicon warping, a substrate in the thermosetting process of a polyimide resin, causing a problem in flatness when chips are mounted. To solve these problems, a sheet with a previously formed wiring portion is provided and bonded to LSIs at low temperature. This method can make the insulating layer of a multilayer wiring portion at least 10 μm thick; when a microstrip line is assumed, the wiring impedance can be set in the range of 50 to 250Ω.

A printed circuit board is available as a wiring board enabling characteristic impedance matching of wiring and using sheet material as an insulating layer. Since glass cloth is mixed in the sheet material to maintain dimension stability, there are limits of making minute through holes or fine wiring.

With downsized workstations, particularly RISC (reduced instruction set computer) system workstations, the performance of VLSI chips represents directly the system performance. To get the best performance from the chips, the packaging form must satisfy the following two points:

1. reducing a signal delay from one chip to another; and
2. increasing characteristic impedance and lessening change is required.

Particularly, in an area in which high-speed operation is required exceeding operation frequency of 500 MHz, the critical path length between chips becomes the largest source determining the cycle time. Hitherto, to solve such a problem, a method of mounting a number of chips on large silicon, such as silicon on silicon (SOS), has been adopted. However, since aluminum is used for wiring in the method, the wiring resistance becomes 10Ω/cm or more; noise occurs in high frequency areas because of the high resistance. Then, a packaging method is required for easily forming a thin film %having low resistance and enabling the wiring length to be shortened and holding a thick insulating layer uniformly thick from the point of lessening change in characteristic impedance.

A microprocessor (MPU) for a high-speed computer operates at a high clock frequency, and is connected to a CPU and a cache memory by a high-speed bus. In a conventional system, MPU and memories are connected on a printed circuit board; this connection method leads to a limiting of the system performance. To exceed the limits, a multi-chip module (MCM) is provided as a method of mounting MPU and memories in a bear chip condition, lessening a chip-to-chip delay caused by mounting the chips, and inhibiting parasitic inductance of the package. As a more advanced method, wiring in MPU and memory chips is drawn out to the outside and a thin film of copper having lower resistance than aluminum is used to form the wiring. This method can also shorten the critical path length between chips. Particularly, when wiring is formed in chips as in the conventional method, chip-to-chip wiring can be used only in portions other than the chip mounting area (active area), thus a layout is restricted. Then, if only active elements such as transistors and diodes, passive elements such as resistors and capacitors, and isolation layers for electrically insulating the elements from each other are formed in each chip and a wiring portion is produced as another body and later is connected to the chips, wiring can also be formed on the chips, improving flexibility of a layout. Since the wiring step most difficult to perform in the manufacturing process can be removed, the chip yield drastically improves and LSIs can be provided at low costs.

DESCRIPTION OF THE PREFERRED EMBODIMENTS

A thin and high-density package board of the invention and a manufacturing method therefor will be discussed with regard to FIGS. 1A to 1D and 2E to 2H. As shown in FIG. 2H, the thin and high-density package board 31 of the invention comprises a substrate 3, a logic LSI 4 and memory LSIs 5 and 6 embedded in spot facing (e.g., recessed) portions 2 formed in the substrate 3, and a multilayer wiring circuit layer 23 placed thereon. In the example shown in FIGS. 1A to 1D and 2E to 2H, the multilayer wiring circuit layer 23 consists of a lower wiring portion 23a and an upper wiring portion 23b. The detailed configuration will be discussed with the manufacturing method.

Figure 1A:
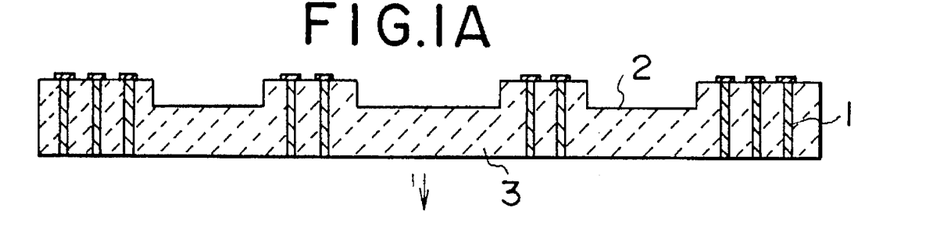
FIGS. 1A to 1D are illustrations showing a manufacturing method of a high-density package board of the invention.
Figure 1B:
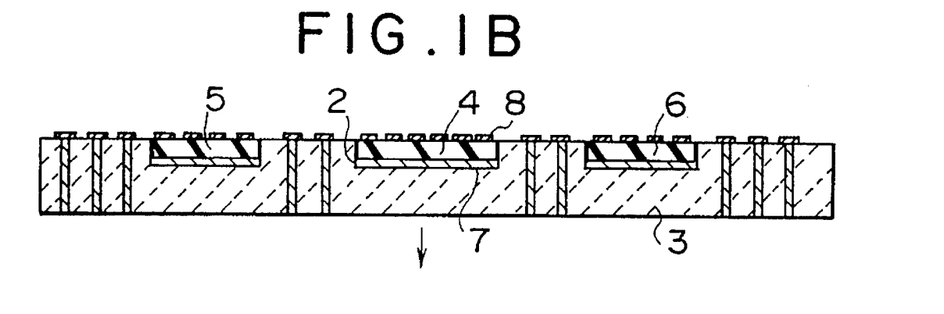

As shown in FIG. 1A, a ceramic substrate 3 being 5 cm×5 cm area, 0.8 mm thick, is provided. The substrate 3 contains internal layer circuitry 1 and is formed with spot facing portions 2 for embedding LSIs. A logic LSI 4 and memory LSIs 5 and 6 are provided as LSIs to be mounted on the substrate. Each of the LSIs 4, 5, and 6, although their internal structures are not shown, has active elements, passive elements, and isolation layers. However, the LSIs 4, 5, and 6 are not provided with wiring for connecting internal: elements. Instead, external output terminals 8 for connecting the elements outside the LSIs are provided each with a contact part exposed to the outside, as shown in FIG. 1B. The LSIs 4, 5, and 6 are embedded in their corresponding spot facing portions 2 and are fixed to the substrate 3 by gold paste 7. The active elements include transistors, diodes, etc. The passive elements include resistors, capacitors, etc. The isolation layers are insulating layers for electrically isolating the elements from each other.

Figure 1C:
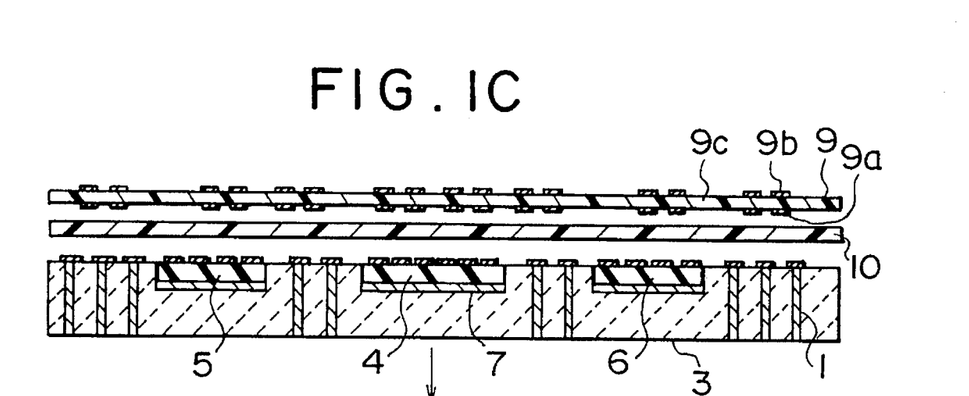
Figure 1D:
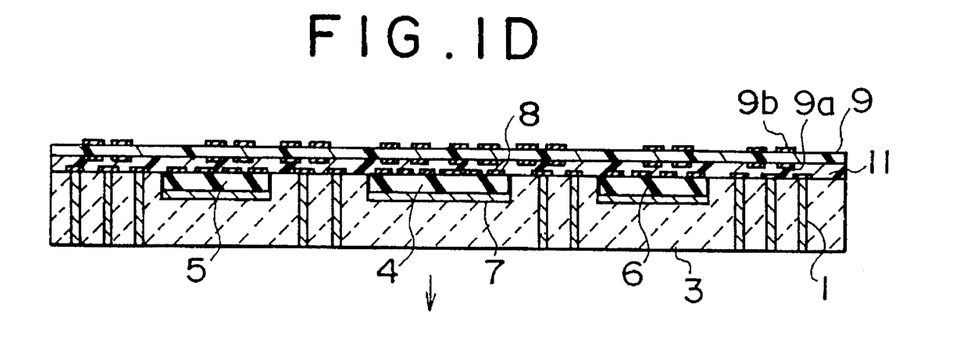

Next, a wiring sheet 9 is provided for forming signal circuitry of the logic LSI 4 and the memory LSIs 5 and 6, as shown in FIG. 1C. The wiring sheet 9 has an insulating layer 9c and copper wiring 9a and 9b placed above and below the insulating layer. The wiring sheet 9 is mounted on the substrate 3 with a heat resisting adhesive sheet 10 therebetween. In this condition, the sheets are heated to 250° C. and crimped onto the substrate 3. For example, N-4 manufactured by Hitachi Chemical Company, Ltd. is used as the heat resisting adhesive sheet 10. Then, as shown in FIG. 1D, the heat resisting adhesive sheet 10 becomes a heat resisting adhesive layer 11, with which the space between the wiring sheet 9 and the substrate 3 is filled. At the time, the space between the external output terminals 8 and the space between the copper wiring 9a are also filled with the heat resisting adhesive layer 11.

Next, the following steps will be discussed with reference to FIGS. 2E to 2H.

Figure 2E:
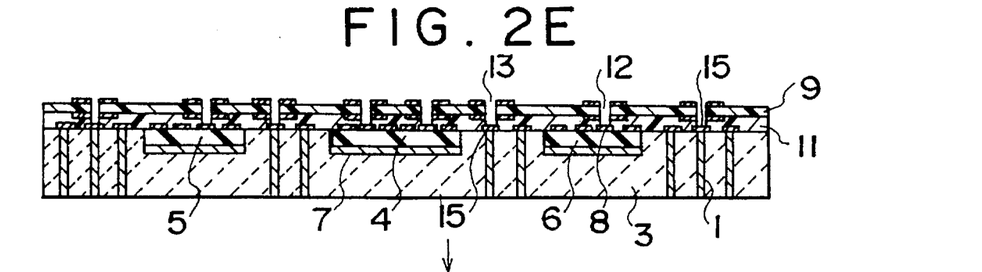
FIGS. 2E to 2H are illustrations showing a continuation of the manufacturing method of the high-density package board of the invention in FIGS. 1A to 1D.
Figure 2F:
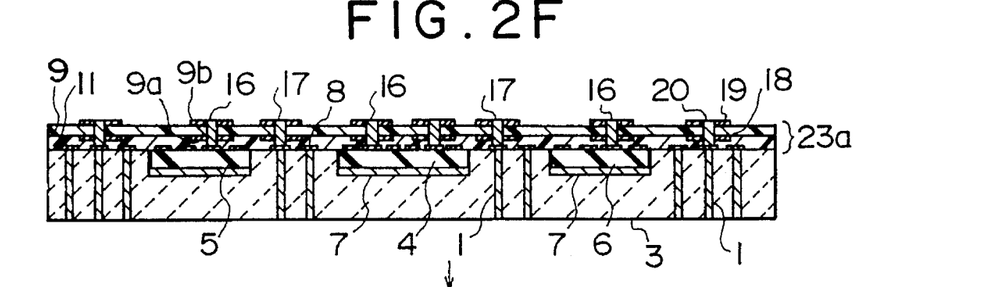

As shown in FIG. 2E, openings 12 and 13 for forming vias are provided just above the external output terminals 8 and surface circuitry 15 on the substrate surface, respectively. The openings 12 and 13 are formed, for example, by making through holes in the insulating layer 9c and the heat resisting adhesive layer 11 with an excimer laser. Next, copper is grown by electroless chemical copper plating in the openings formed just above the external output terminals 8 and surface circuitry 15 on the substrate surface. Then, vias 16 and 17 are formed with the openings 12 and 13 filled with copper, as shown in FIG. 2F. If the wiring sheet 9 is provided with a repair circuit 18 and a repair pad 19, a via 20 is formed by electroless chemical copper plating in the step in a similar manner, and necessary connection is made. Then, the lower wiring portion 23a is formed.

Figure 2G:
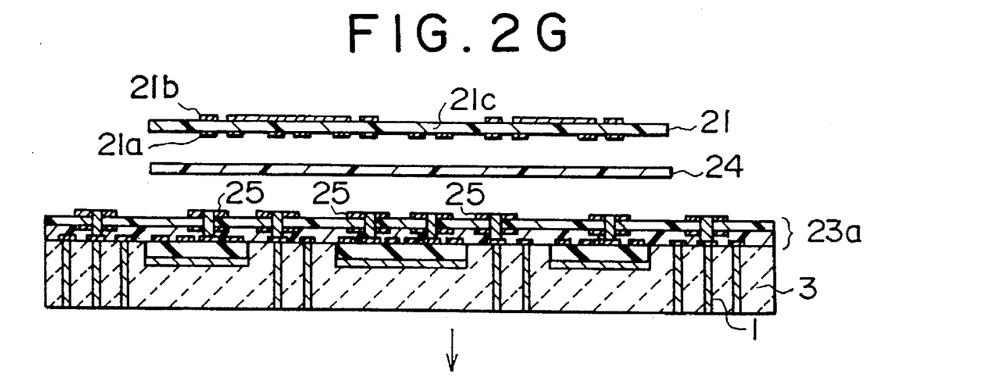
Figure 2H:
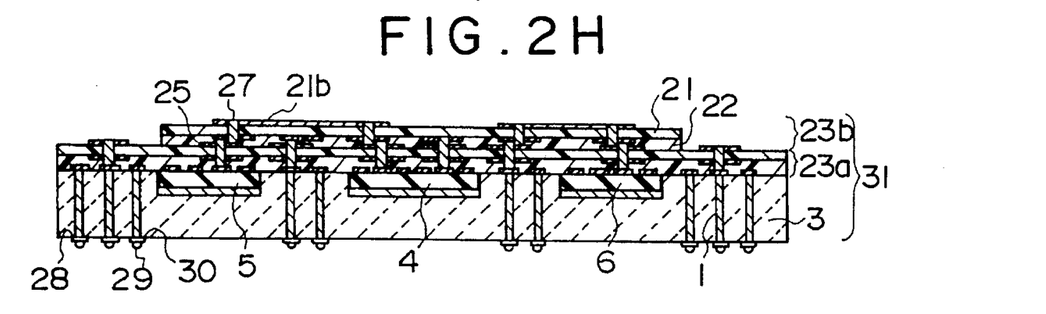

Next, to form the upper wiring portion 23b, as shown in FIG. 2G, a wiring sheet 21 is placed on the lower wiring portion 23a with a heat resisting sheet 24 between, and the sheets are heated to 250° C. and crimped as with the lower wiring portion 23a. The wiring sheet 21 comprises copper wiring 21a and 21b used for signal transfer formed on both faces of an insulating layer 21c. Each of the copper wiring 21a and 21b is formed as wiring width space: 20/20 µm and thickness 20 µm. The heat resisting sheet 24 is made of the same material as the heat resisting sheet 10 used in FIG. 1C, for example. It is heated to form a heat resisting adhesive layer 22.

Next, an opening is made in the insulating layer 21c and the heat resisting adhesive layer 22 with an excimer laser as described above, and a via 27 is formed by electroless chemical copper plating. At the time, a part of copper wiring placed on the top of the lower wiring portion 23a functions as a connection pad 25. Therefore, the copper wiring 21b and the connection pad 25 are electrically connected by the via 27.

Last, power supply connection output pins 29 are connected by solder 30 to external output terminals 28 exposed as ends of the internal layer circuitry on the rear of the substrate 3.

The thin and high-density package board 31 being 1 mm thick or less for high-speed processors can be produced by executing the aforementioned steps.

The inventors executed an LSI drive test for the package board 31 thus manufactured and ensured that it can be driven at operation frequencies 500 MHz to 1 GHz. It is considered that LSIs operating at operation frequency 10 GHz can also be driven by applying the invention.

Figure 3:
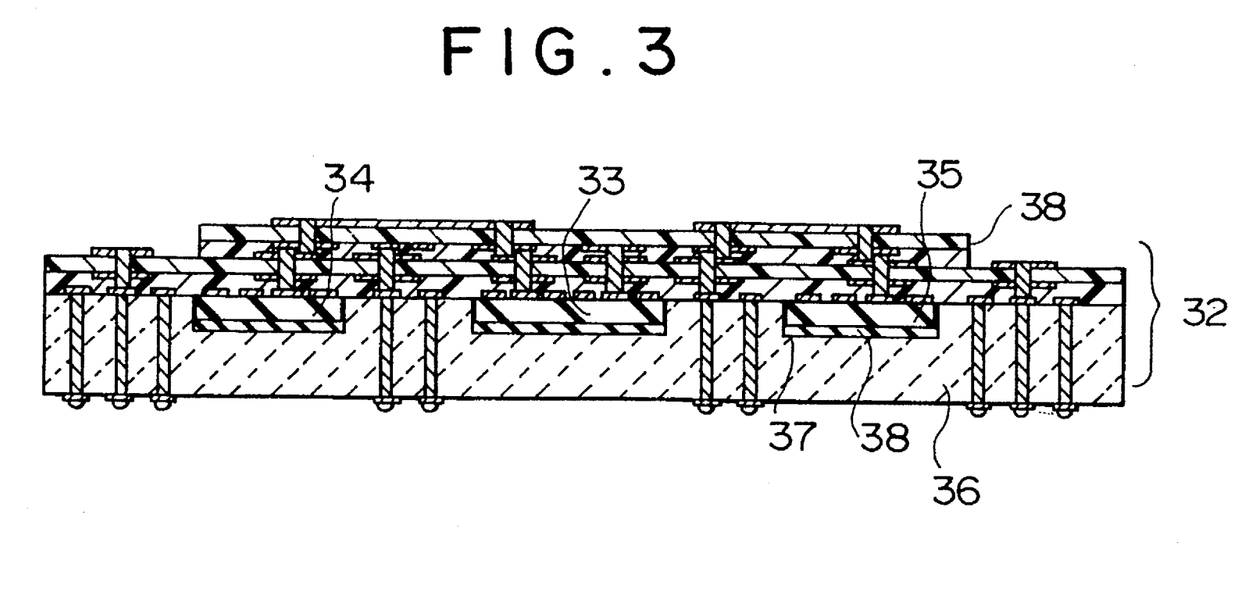
FIG. 3 is an illustration showing another high-density package board of the invention.

FIG. 3 shows a manufacturing method of another thin and high-density package board 32 of the invention. As a method of bonding a logic LSI 33 and memory LSIs 34 and 35 to spot facing (e.g., recessed) portions 37 of a ceramic substrate 36, a bonding method with nonmetal such as heat resisting silicone rubber or elastomer can be used in addition to the method of fixing with metal brazing material such as gold paste and solder described above. FIG. 3 shows the package board with the LSIs 33, 34, and 35 fixed to the spot facing portions 37 of the ceramic substrate 36 with heat resisting silicone rubber 38 serving as a stress cushion.

Since the thin-film package board of the invention uses a heat resisting adhesive sheet constant in thickness as the insulating layer, the thickness of the insulating layer can always be set to a constant value and the characteristic impedance ($Z_0$) can be suppressed to a value within 5% of the design value. Thus, the package board can also follow easily a circuit with a small reflection loss and operation frequency 500 MHz or more, enabling signal transfer at high speed.

Figure 4:
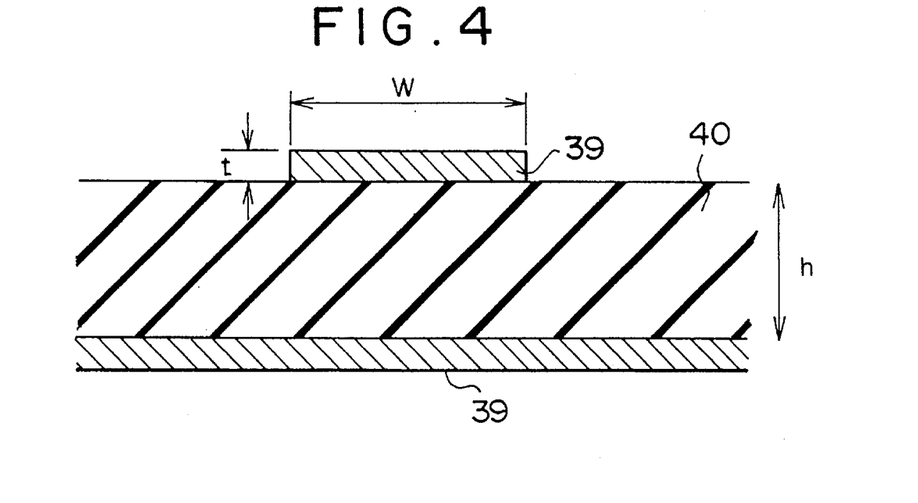
FIG. 4 is a drawing in schematic form depicting multi-layer wiring circuitry of the high-density package board of the invention as a microstrip line.

FIG. 4 is a drawing in schematic form depicting the multilayer wiring circuitry of the package board of the invention as a microstrip line. Assuming that the wiring form is a rectangle with an aspect ratio 1 (t=W in the figure), the characteristic impedance ($Z_0$) of the wiring is represented as a function of t/h, a ratio between thickness t of wiring layer 39 and thickness h of insulating layer 40.

Figure 5:
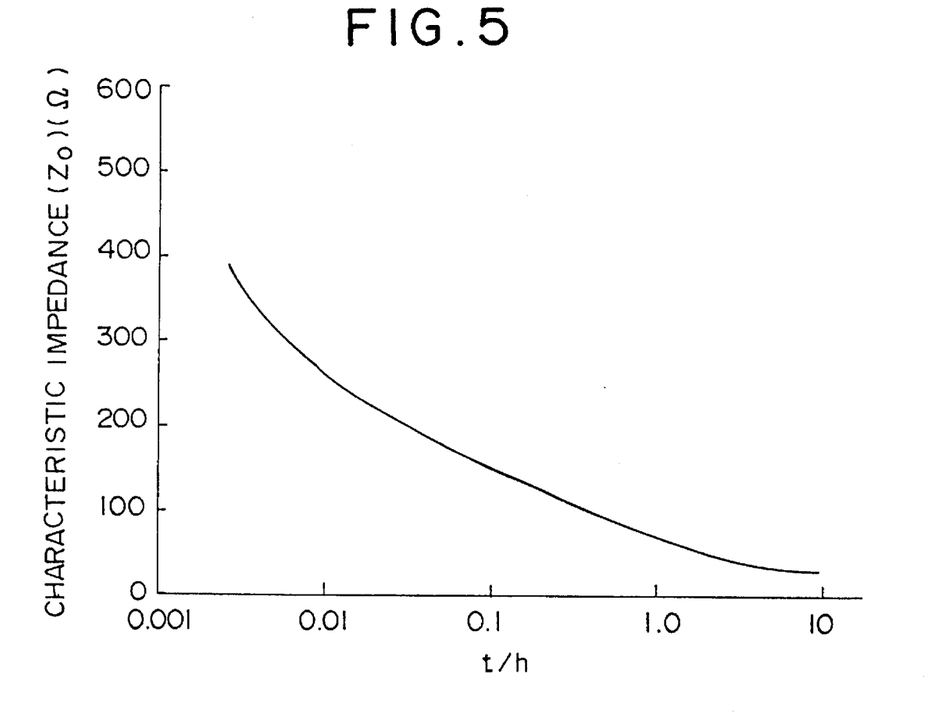
FIG. 5 is a graph showing the relationship between characteristic impedance of wiring, $Z_0$, and a ratio between wiring layer thickness t and insulating layer thickness h, t/h.

FIG. 5 shows the relationship between t/h and $Z_0$. When t/h=0.01, namely, the wiring layer thickness is 1 and the insulating layer thickness is 100, $Z_0$ becomes about 250 Ω; when t/h=0.1, namely, the wiring layer thickness is 1 and the insulating layer thickness is 10, $Z_0$ becomes about 150 Ω; when t/h=1, namely, the wiring layer thickness and the insulating layer thickness are the same, $Z_0$ becomes about 60 Ω.

Figure 6:
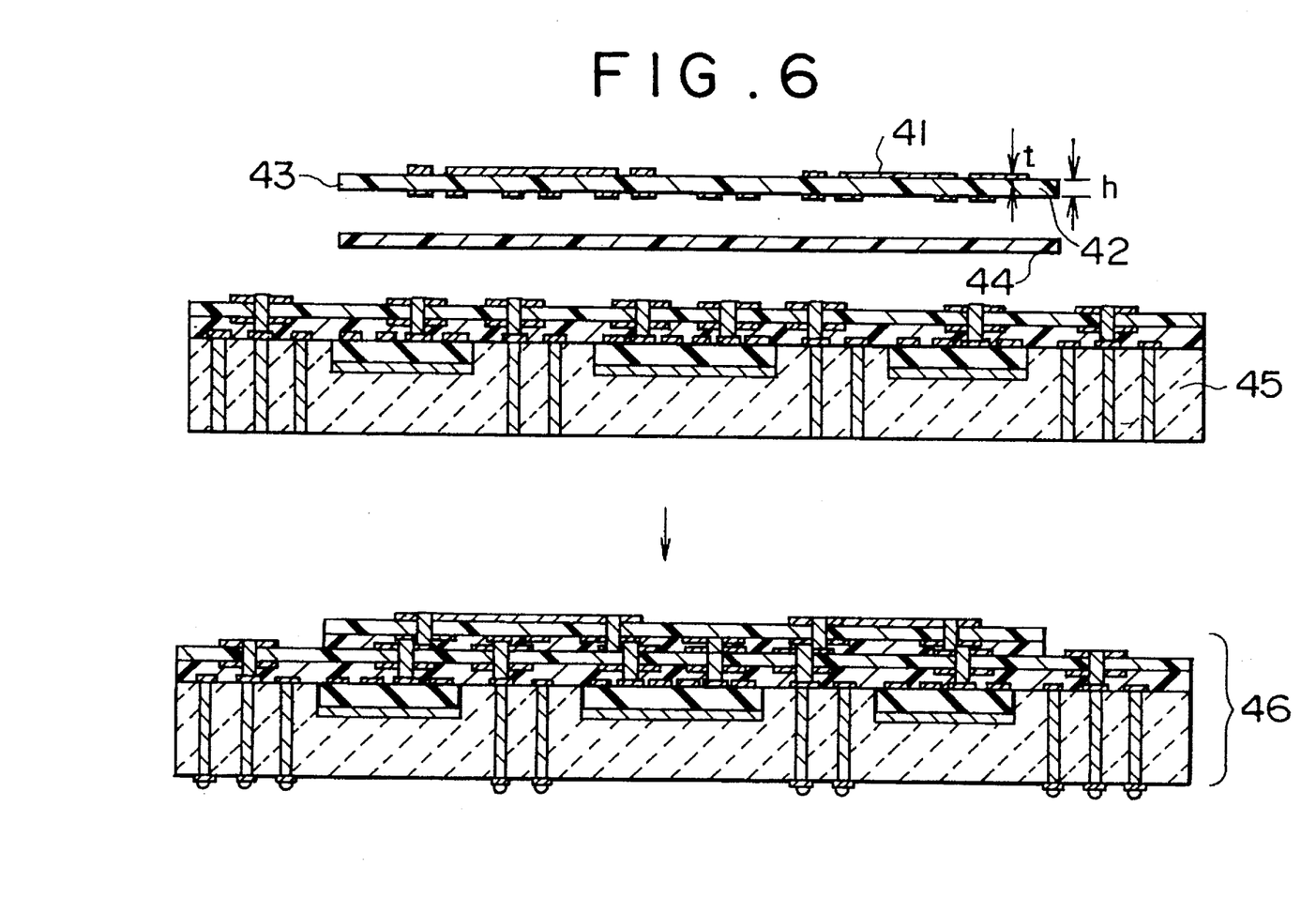
FIG. 6 is an illustration showing still another high-density package board of the invention.

FIG. 6 shows another package board 46 of the invention provided by heating and crimping a wiring sheet having a wiring layer 41 whose thickness t is 20 µm and an insulating layer 42 whose thickness h is 40 µm onto a ceramic substrate 45 using a heat resisting-adhesive sheet 44.

When the characteristic impedance ($Z_0$) of the package board is found from FIG. 5, it results in about 100 Ω from t/h=0.5. The package board allows the thicknesses of the heat resisting adhesive sheet and the insulating layer sheet to be changed as desired. According to the current sheet material specifications, materials with h=10–200 µm are available. According to a dry process such as a thin-film photoetching technique, selective plating technique, or lift off, the wiring layers with t=1–50 µm can be formed. From the numeric values, the design allowable range of the package board is t/h=0.005–5. In this case, the characteristic impedance ($Z_0$) of the package board becomes 250–50 Ω. With the package board, assuming that the wiring layer thickness is 20 µm, that the sheet thickness is 40 µm, and that the number of layers of the multilayer wiring is four, the multilayer wiring portion thickness becomes 180 µm. Assuming that the ceramic substrate thickness is 0.8 mm, the entire package board thickness becomes 0.98 mm; package boards 1 mm thick or less can also be supplied.

Figure 7:
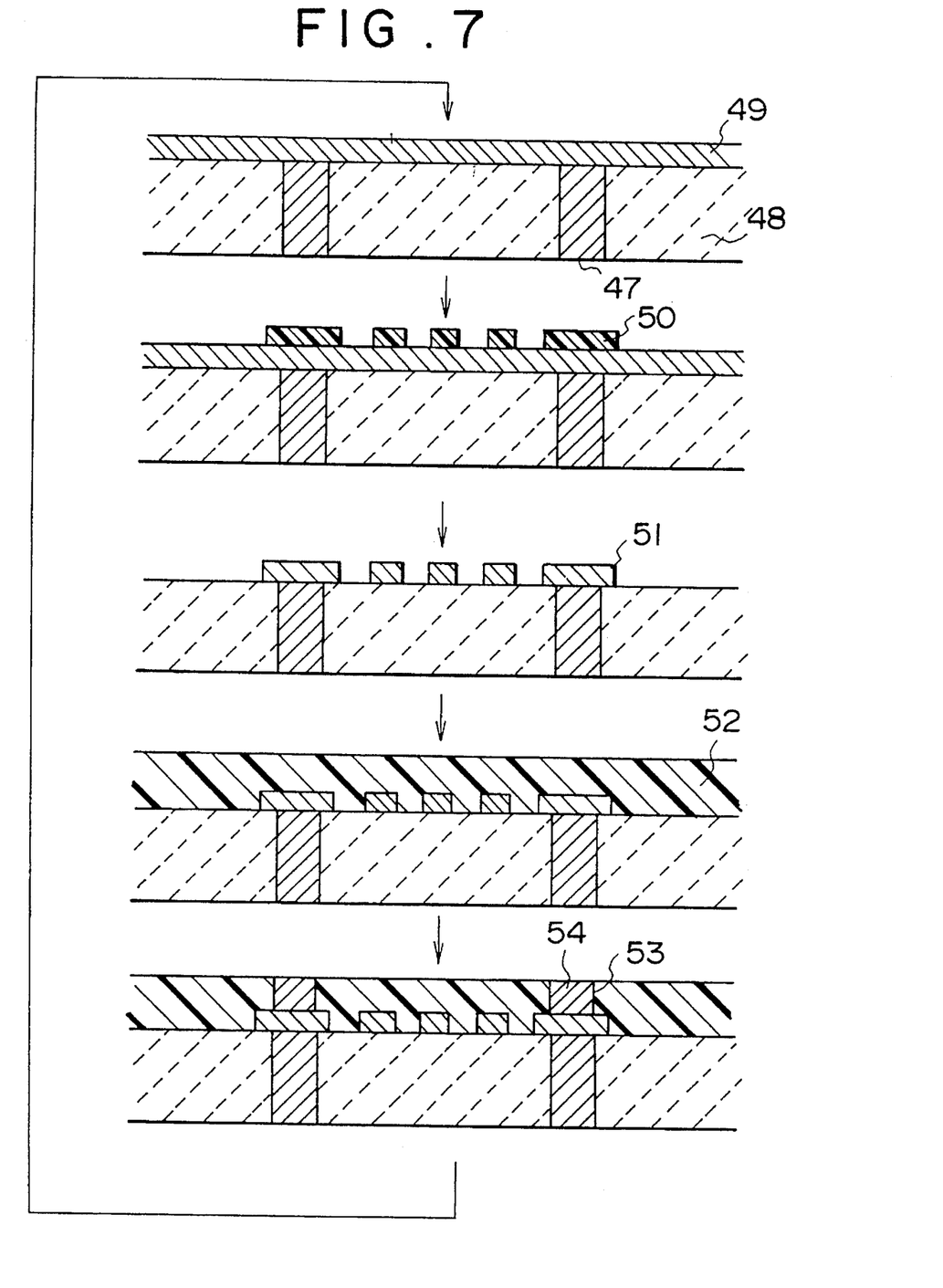
FIG. 7 is an illustration showing a manufacturing method of another high-density package board of the invention.

A manufacturing method of another package board of the invention having multilayer wiring laminated using a heat resisting adhesive sheet will be discussed with reference to FIG. 7. A 2-layer film 49 (Cr/Cu: 0.2 µm/5 µm) is formed by sputtering on a ceramic substrate 48 having internal layer wiring 47. Next, a resist film 50 is prepared and a wring pattern 51 is provided by etching, then a 2-layer film consisting of a polyimide film low in thermal expansion and an adhesive film are heated and crimped, whereby the wiring pattern is filled with the adhesive film and the surface thereof is flattened to provide an insulating layer 52. Next, an excimer laser (KrF: 248 nm) is used to make a nonthrough hole 53 with Ø 25 µm by a mask projection method and a conductor wiring 54 is formed in the opening by a chemical copper plating method. Multilayer wiring 56 consisting of six layers in total is provided on a ceramic substrate 55 shown in FIG. 8 by repeating the steps.

Figure 8:
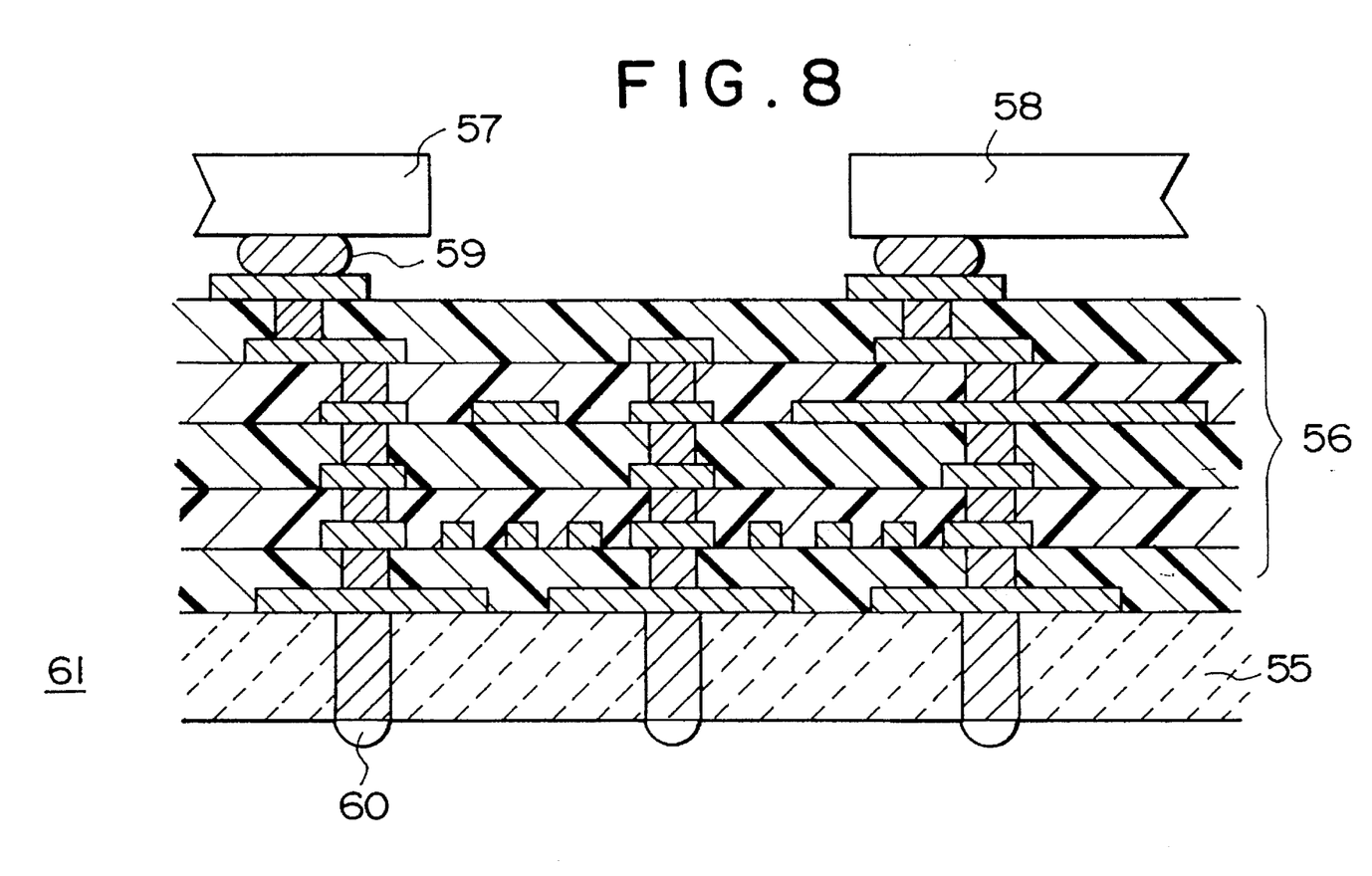
FIG. 8 is a sectional view of the high-density package board of the invention in FIG. 7.

Last, as shown in FIG. 8, a memory LSI 57 and a logic LSI 58 are electrically connected to the multilayer wiring 56 by soldering 59 and the ceramic substrate 55 is formed with external connection terminals 60, providing a package board 61 compatible with general-purpose mainframe computers and high-speed processors.

Figure 9:
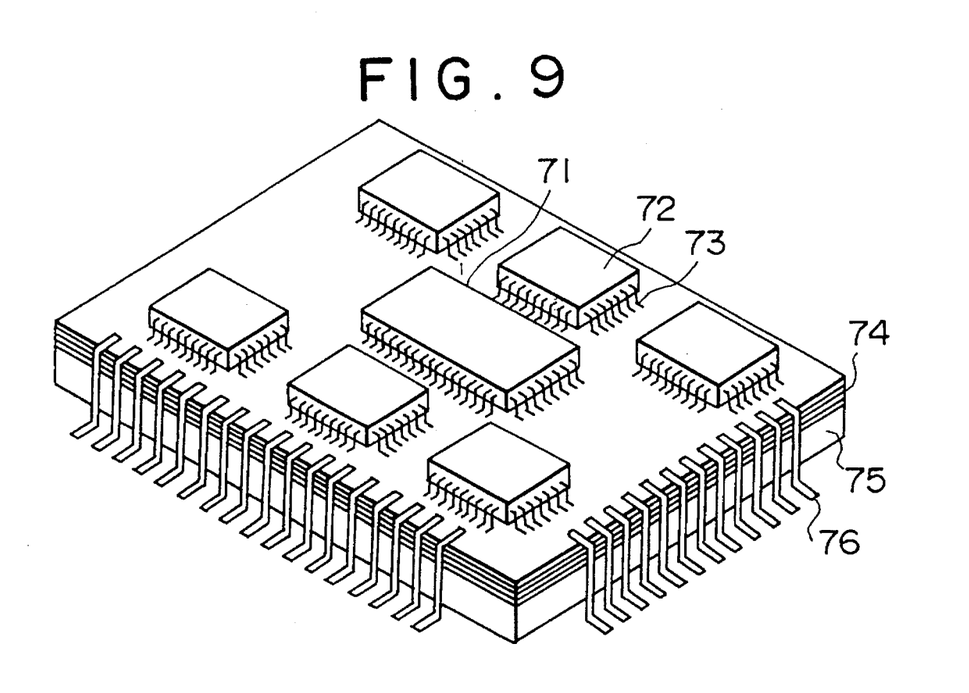
FIG. 9 is a schematic diagram of a LAN LSI module board of the invention.

FIG. 9 shows an example of applying the concept of the package boards of the invention to a LAN LSI module board (LAN card) that can be operated in personal computers.

Memory LSI packages 71 and a logic LSI package 72 are connected to sheet-like multilayer signal wiring circuitry 74 and a substrate 75 by external terminals 73 for connection and the LSI module board is connected to a personal computer by external connection terminals 76.

Figure 10:
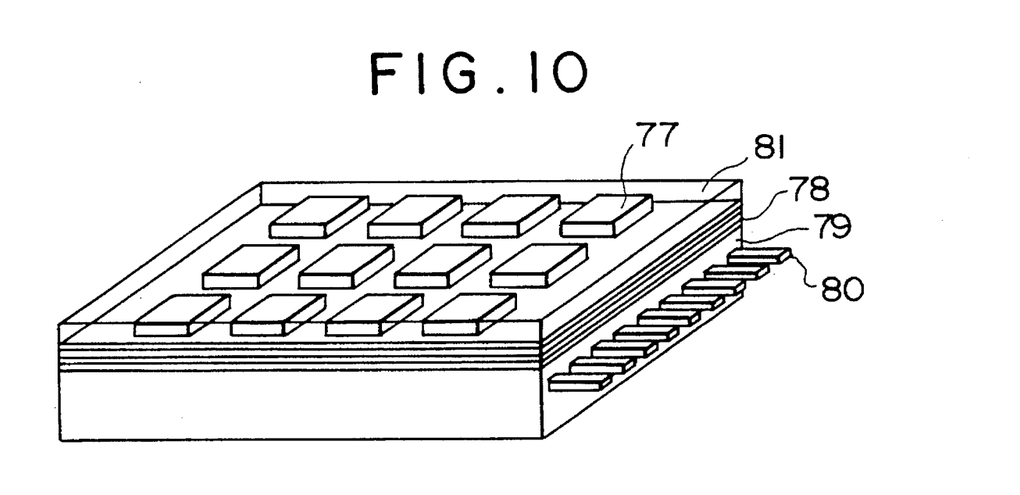
FIG. 10 is an illustration showing an example of a memory card to which the concept of the package boards of the invention is applied.

FIG. 10 shows an example of applying the concept of the package boards of the invention to a memory card for personal computers. Memory LSIs 77 are electrically connected to sheet-like multilayer signal wiring circuitry 78 and the memory card is connected via a substrate 79 to a personal computer by external connection terminals 80. The LSIs are coated with a film 81 for protection.

Figure 11:
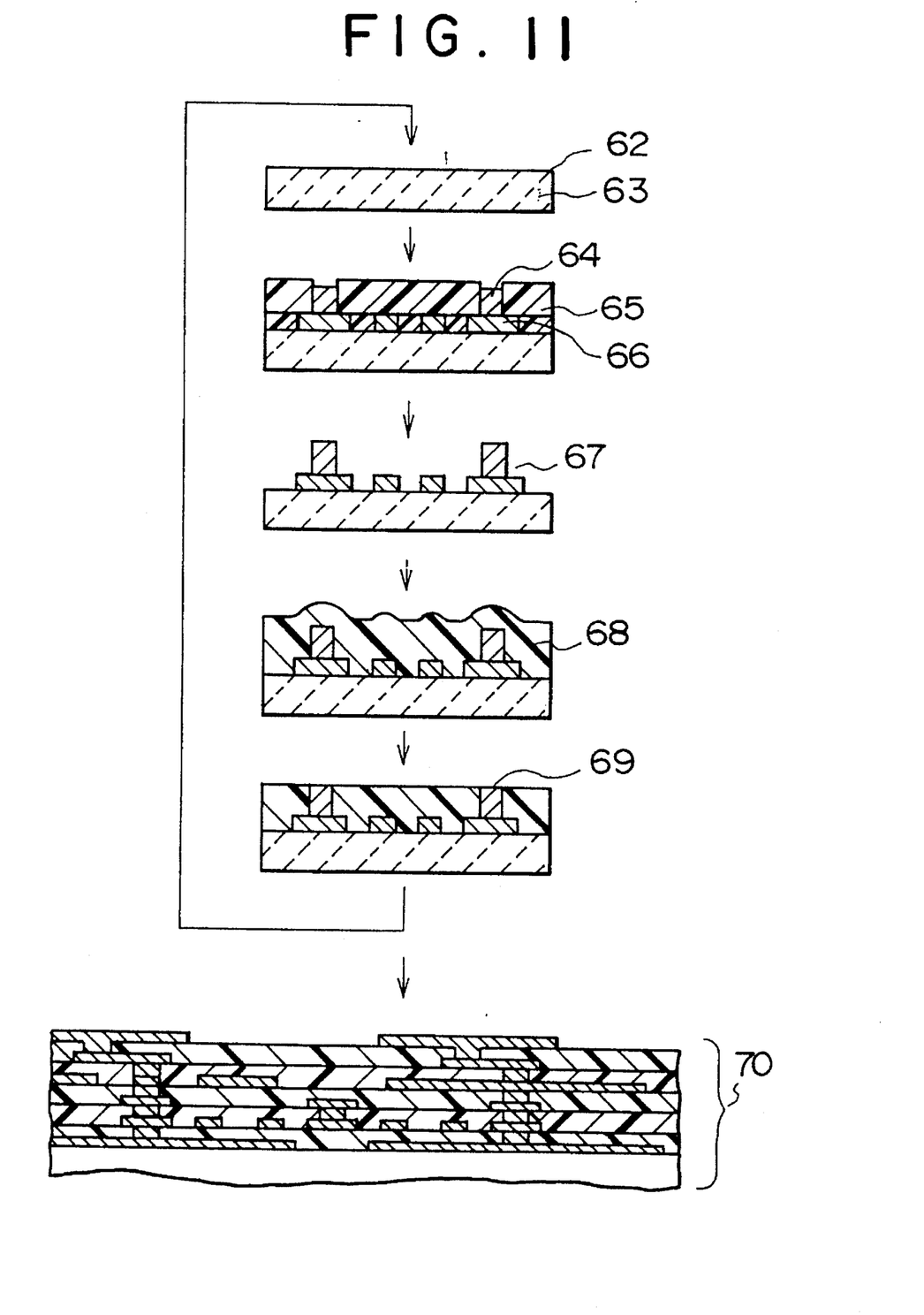
FIG. 11 is an illustration showing a manufacturing example of a package board by a conventional sequential thin film forming method.

Next, an example of a package board manufactured by a conventional sequential thin film forming method will be discussed as a control example with reference to FIG. 11.

First, a thin underlaying film 62, 0.5 µm thick consisting of three layers of chromium, copper, and chromium for copper wiring is formed on a silicon substrate 63 by sputtering. Next, a photoresist pattern 65 is formed and signal circuitry 66 and via studs 64 for interlayer connection are formed by electric copper plating. Subsequently, the photoresist is removed, then the thin underlaying film is removed by sputter etching and pattern separation is made to produce wiring 67 of the first layer. Next, a polyamic acid for an insulating film is applied, then curing is performed to form a polyimide insulating film 68 20 μm thick. Further, the polyimide film is flattened by polishing and copper wiring in the via studs 64 is led out for exposing connection parts 69. A package board 70 is provided by repeating the steps. Since the silicon substrate warps upon exceeding 200 μin the process, it cannot be connected to a power supply board.

What is claimed is:

1. A package board comprising at least one memory large-scaled integrated circuit device, at least one logic large-scaled integrated circuit device, a substrate for mounting said devices, and a multilayer wiring circuit layer formed on said substrate, wherein signal circuitry of said memory and logic large-scaled integrated circuit devices is formed in said multilayer wiring circuit layer, on said substrate, and is electrically connected to said memory and logic large-scaled integrated circuit devices via external terminals of said memory and logic large-scaled integrated circuit devices, said multilayer wiring circuit layer having a smaller wiring resistance than that of said memory and logic large-scaled integrated circuit devices.

2. A package board comprising at least one memory large-scaled integrated circuit device, at least one logic large-scaled integrated circuit device, a substrate for mounting said devices, and a multilayer wiring circuit layer formed on said substrate, wherein signal circuitry of said memory and logic large-scaled integrated circuit devices is formed in said multilayer wiring circuit layer, on said substrate, and is electrically connected to said memory and logic large-scaled integrated circuit devices via external terminals Of said memory and logic large-scaled integrated circuit devices, said multilayer wiring circuit layer having a characteristic impedance of 50–250 Ω and a wiring pitch of 1 μm–50 μm.

3. A package board comprising at least one memory large-scaled integrated circuit device, at least one logic large-scaled integrated circuit device, a substrate for mounting said devices, and a multilayer wiring circuit layer formed on said substrate, wherein signal circuitry of said memory and logic large-scaled integrated circuit devices is formed in said multilayer wiring circuit layer, on said substrate, and is electrically connected to said memory and logic large-scaled integrated circuit devices via external terminals of said memory and logic large-scaled integrated circuit devices, and wherein matching of signal transfer in an operation frequency zone of 500 MHz–10 GHz is enabled.

4. A package, board comprising at least one memory large-scaled integrated circuit device, at least one logic large-scaled integrated circuit device, a substrate in which said devices are embedded, and a multilayer wiring circuit layer formed on said substrate, wherein signal circuitry of said memory and logic large-scaled integrated circuit devices is formed in said multilayer wiring circuit layer, on said substrate, and is electrically connected to said memory and logic large-scaled integrated circuit devices via external terminals of said memory and logic large-scaled integrated circuit devices, said package board having a thickness of 1 mm or less.

5. A memory large-scaled integrated circuit element card comprising a package board comprising at least one memory large-scaled integrated circuit device, a substrate for mounting said device, and a multilayer wiring circuit layer formed on said substrate, wherein signal circuitry of said at least one memory large-scaled integrated circuit device is formed in said multilayer wiring circuit layer on said substrate and is electrically connected to said at least one memory large-scaled integrated circuit device via external terminals of each of said at least one memory large-scaled integrated circuit device, said multilayer wiring circuit layer having a smaller wiring resistance than that of said at least one memory large-scaled integrated circuit device.

6. A package board according to claim 3, which is provided for use in a local area network integrated circuit card.

7. A package board according to claim 2, which is provided for use in a local area network integrated circuit card.

8. A package board according to claim 3, which is provided for use in a local area network integrated circuit card.

9. A package board according to claim 1, wherein said multilayer wiring circuit layer has a characteristic impedance of 50–250 Ω and a wiring pitch of 1 μm–50 μm.

10. A package board according to claim 9, wherein said multilayer wiring circuit layer is such that matching of signal transfer in an operation frequency zone of 500 MHz–10 GHz is enabled.

11. A package board according to claim 1, wherein said multilayer wiring circuit layer is such that matching of signal transfer in an operation frequency zone of 500 MHz–10 GHz is enabled.

12. A package board according to claim 10, wherein said package board has a thickness of 1 mm or less.

13. A package board according to claim 9, wherein said package board has a thickness of 1 mm or less.

14. A package board according to claim 1, wherein said package board has a thickness of 1 mm or less.

15. A package board according to claim 1, wherein said substrate is provided with recessed portions for embedding therein individual ones of said memory and logic large-scaled integrated circuit devices.

16. A package board according to claim 2, wherein said substrate is provided with recessed portions for embedding therein individual ones of said memory and logic large-scaled integrated circuit devices.

17. A package board according to claim 3, wherein said substrate is provided with recessed portions for embedding therein individual ones of said memory and logic large-scaled integrated circuit devices.

18. A package board according to claim 4, wherein said substrate is provided with recessed portions for embedding therein individual ones of said memory and logic large-scaled integrated circuit devices.

19. A package board according to claim 1, wherein said external terminals of said memory and logic large-scaled integrated circuit devices are led out from a side of said substrate opposite that on which said multilayer wiring circuit layer is provided.

20. A package board according to claim 2, wherein said external terminals of said memory and logic large-scaled integrated circuit devices are led out from a side of said substrate opposite that on which said multilayer wiring circuit layer is provided.

21. A package board according to claim 3, wherein said external terminals of said memory and logic large-scaled integrated circuit devices are led out from a side of said substrate opposite that on which said multilayer wiring circuit layer is provided.

22. A package board according to claim 4, wherein said external terminals of said memory and logic large-scaled integrated circuit devices are led out from a side of said substrate opposite that on which said multilayer wiring circuit layer is provided.

23. A package board according to claim 5, wherein said multilayer wiring circuit layer has a characteristic impedance of 50–250 Ω and wiring pitch of 1 μm–50 μm.

24. A memory large-scaled integrated circuit element card comprising a package board comprising at least one memory large-scaled integrated circuit device, a substrate for mounting said device, and a multilayer wiring circuit layer formed on said substrate, wherein signal circuitry of said at least one memory large-scaled integrated circuit device is formed in said multilayer wiring circuit layer on said substrate and is electrically connected to said at least one memory large-scaled integrated circuit device via external terminals of each of said at least one memory large-scaled integrated circuit device, and wherein said multilayer wiring circuit layer has a characteristic impedance of 50–250 Ω and a wiring pitch of 1 μm–50 μm.

* * * * *